US008178170B2

(12) United States Patent
Linden et al.

(10) Patent No.: US 8,178,170 B2
(45) Date of Patent: May 15, 2012

(54) METHOD FOR DEPOSITING INORGANIC/ORGANIC FILMS

(75) Inventors: Joannes Leonard Linden, Eindhoven (NL); Gregory Robert Alcott, Geldrop (NL); Edward Aloys Gerard Hamers, Eindhoven (NL); Mauritius Cornelis Maria van de Sanden, Tilburg (NL)

(73) Assignee: Nederlandse Organisatie voor toegepast-natuurwetenschappelijk onderzoek TNO, Delft (NL)

( * ) Notice: Subject to any disclaimer, the term of this patent is extended or adjusted under 35 U.S.C. 154(b) by 1436 days.

(21) Appl. No.: 10/501,225

(22) PCT Filed: Jan. 17, 2003

(86) PCT No.: PCT/NL03/00037
§ 371 (c)(1),
(2), (4) Date: Feb. 4, 2005

(87) PCT Pub. No.: WO03/066933
PCT Pub. Date: Aug. 14, 2003

(65) Prior Publication Data
US 2005/0118427 A1 Jun. 2, 2005

(30) Foreign Application Priority Data
Jan. 18, 2002 (NL) .................................... 1019781

(51) Int. Cl.
*H05H 1/24* (2006.01)
(52) U.S. Cl. ...................................... 427/569
(58) Field of Classification Search .................. 427/488, 427/569
See application file for complete search history.

(56) References Cited

U.S. PATENT DOCUMENTS

| | | | | |
|---|---|---|---|---|
| 5,021,114 | A | * | 6/1991 | Saito et al. ............... 156/345.42 |
| 5,024,927 | A | * | 6/1991 | Yamada et al. .......... 430/270.14 |
| 5,094,879 | A | | 3/1992 | Matsuda et al. |
| 5,522,343 | A | | 6/1996 | Kodama et al. |
| 5,643,638 | A | * | 7/1997 | Otto et al. ..................... 427/569 |
| 6,068,884 | A | | 5/2000 | Rose et al. |
| 6,383,896 | B1 | | 5/2002 | Kirimura et al. |
| 6,465,057 | B1 | * | 10/2002 | Nakahigashi et al. ........ 427/569 |
| 2001/0081570 | | | 3/2001 | Kiyoshi |

FOREIGN PATENT DOCUMENTS

| | | |
|---|---|---|
| FR | 2 708 624 | 2/1995 |
| WO | WO 99/61371 | 12/1999 |
| WO | WO 01/36703 A1 | 5/2001 |

OTHER PUBLICATIONS

Akio Okamoto, et al., Structure of Gold-Hydrocarbon Composite Thin Films Deposited Using Low-Voltage Plasma Sputtering Method, Thin Solid Films 281-282 (1996) 390-392, XP 000643425.

* cited by examiner

*Primary Examiner* — Elena T Lightfoot
(74) *Attorney, Agent, or Firm* — Lucas & Mercanti, LLP

(57) ABSTRACT

The present invention describes a method for applying a hybrid coating to a substrate. A coating according to the invention is formed by an inorganic component and an organic component. As a result, this coating has the hybrid character whereby the advantages of inter alia hardness are combined with flexibility. The invention also describes a device for the manufacture of a hybrid coating.

21 Claims, 1 Drawing Sheet

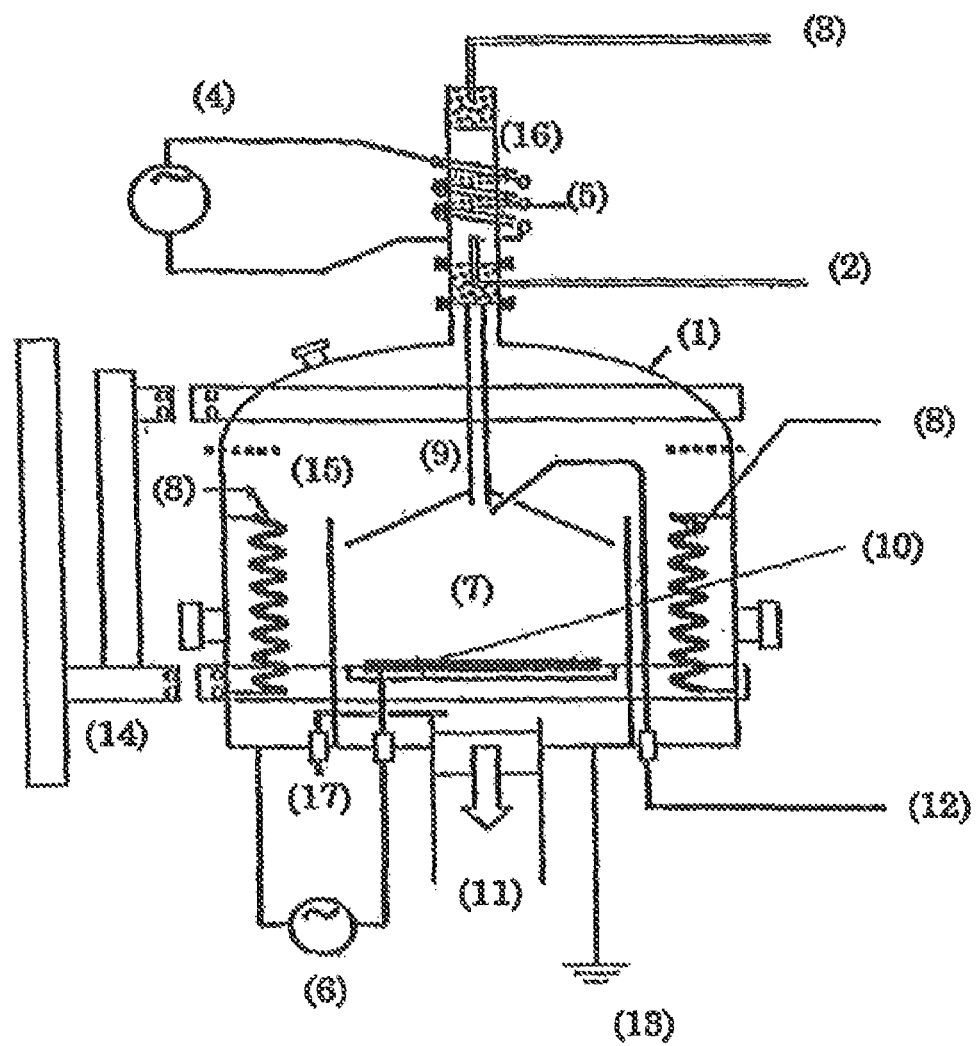

METHOD FOR DEPOSITING INORGANIC/ORGANIC FILMS

CROSS-REFERENCE TO RELATED APPLICATIONS

This application is a 371 of PCT/NL03/00037 filed Jan. 17, 2003 which claims priority to and the benefit of Dutch Patent Application No. 1019781 filed on Jan. 18, 2002, the contents of which are incorporated herein by reference in their entirety.

FIELD OF THE INVENTION

The invention relates to methods for the manufacture of hybrid coatings and to devices for the manufacture thereof.

BACKGROUND OF THE INVENTION

Hybrid materials that are built up from inorganic and organic components form a very important development within materials technology. These materials combine the favorable properties of inorganic and ceramic materials, such as high mechanical strength and a high degree of wear and scratch resistance, with the favorable properties such as a high degree of flexibility and impact resistance of organic materials. Hybrid materials are formed from inorganic and organic components by bonding these chemically with each other at a molecular level. They can be built up as interwoven networks, as interwoven networks mutually bonded by covalent chemical bonds and as interwoven networks having therein homogeneously distributed nanoparticles, which may or may not be covalently bonded, of, e.g., silicon, aluminum, zirconium, cesium, molybdenum or titanium oxides, and/or nitrides and/or carbides thereof.

Coatings manufactured from hybrid materials have a multiplicity of applications. It is possible to apply these materials in a patterned or completely covering manner. The combination of flexibility and hardness makes them ideal as coatings for plastics, in particular plastics from the ophthalmic industry. The low permeability (oxygen, water) of hybrid materials provides for excellent barriers for food packaging and through adaptation of the organic network, anti-adhesion layers for use in bathrooms or on kitchen utensils can be manufactured.

Currently, hybrid coatings are manufactured by means of wet-chemical techniques and deposited on the article of interest, a substrate, by means of dipping, spraying, flow-coating or spin-coating. However, these methods for the manufacture of hybrid coatings require several process steps, long curing periods, prolonged preserving steps and the use of large amounts of solvents.

In the use of CVD (chemical vapor deposition) according to the prior art, it is difficult to deposit a hybrid material of a desired composition under controlled conditions as a coating on a substrate. The activation in a chemical vapor of the separate components requires completely different conditions for the inorganic and for the organic component. As a result, obtaining a fully integrated network of the two components is very difficult.

BRIEF DESCRIPTION OF THE DRAWINGS

FIG. 1 shows a reactor vessel.

SUMMARY OF THE INVENTION

One object of the present invention is to provide methods for the application of a hybrid coating that obviate the problems of the prior art.

Another object of the present invention is to provide a hybrid coating having improved scratch resistance.

Surprisingly, it has been found that an improvement for the wet-chemical coating method from the prior art can be obtained by making use of plasma activated deposition of the hybrid material from a chemical vapor phase, whereby nanoparticles are captured in the coating. A hybrid coating consisting of an organic and an inorganic component having improved wear properties could be manufactured inter alia by a process of chemical vapor deposition or CVD with two separate plasmas.

DETAILED DESCRIPTION OF THE INVENTION

The present invention relates to a method for applying a hybrid coating to a substrate, which coating comprises an inorganic and an organic component and which inorganic component comprises nanoparticles, wherein precursors for these components are activated in one or more plasma sources for plasma activated deposition of a chemical vapor phase and wherein the activated precursors are combined before they are deposited on the substrate from the chemical vapor phase for forming the coating.

The present invention further relates to a method for applying a hybrid coating to a substrate, which coating comprises an inorganic and an organic component and which inorganic component comprises nanoparticles, wherein precursors for these components are activated in two or more separate plasma sources for plasma activated deposition of a chemical vapor phase and wherein one of the two activated precursors passes the plasma for activation of the other precursor whereafter the activated precursors are combined before they are deposited on the substrate from the chemical vapor phase for forming the coating.

Further, the invention relates to a hybrid coating which is obtained according to a method of the invention and to products which comprise such a hybrid coating.

The invention further provides a device for applying a hybrid coating of an inorganic and an organic component to a substrate through plasma activated deposition of a chemical vapor phase, which comprises a reactor space provided with a carrier for a substrate, and at least two separate plasma sources for forming the inorganic and the organic component, the separate plasma sources being situated in the processing direction such that the two activated precursors are combined before being deposited on the substrate.

In addition, the invention provides a device for applying a hybrid coating of an inorganic and an organic component, which inorganic component comprises nanoparticles, to a substrate through plasma activated deposition of a chemical vapor phase, which comprises a reactor space provided with a carrier for a substrate, and at least two separate plasma sources for forming the inorganic and the organic component, the separate plasma sources being situated in the processing direction such that one of the two activated precursors passes the plasma for activation of the other precursor before being deposited on the substrate.

A coating according to the invention is formed by an integrated network of an inorganic component and an organic component. As a result, this coating has the hybrid character whereby the advantages of hardness are combined with a high degree of flexibility.

A hybrid coating manufactured according to a method of the invention is built up as interwoven networks having therein homogeneously distributed nanoparticles which may or may not be covalently bonded, of, e.g., silicon oxides, metal oxides, silicon carbides, metal carbides, silicon nitrides and/or metal nitrides or combinations thereof. The nanoparticles preferably have a diameter of less than 450 nm, more preferably a diameter of less than 100 nm.

Hybrid materials according to the present invention may be built up from a large variety of inorganic and organic components which are chemically bonded to each other at a molecular level. Thus, a hybrid coating according to the invention can comprises an inorganic (for instance glassy) network that has been modified with organic residue groups. Such a structure is sometimes referred to as Ormocer. A hybrid coating according to the invention having the structure that is designated as Ormocer can comprise an organically modified matrix based on a metal oxide, metal carbide and/or metal nitride or a silicon oxide, silicon carbide and/or silicon nitride. Through the character of the plasma activated deposition according to the invention, the organic residue group can take any form in which carbon, silicon and optionally oxygen atoms or carbon, metal and optionally oxygen atoms are combined with each other.

For the metal, any metal can be chosen. Preferably, the metal is selected from the group consisting of aluminum, cadmium, cerium, chromium, cobalt, gold, copper, lanthanum, lead, manganese, molybdenum, nickel, osmium, palladium, platinum, tin, titanium, vanadium, tungsten, iron, silver, zinc, zirconium, alkali metals and alkaline earth metals. More preferably, the metal is Al, Mo, Ti, Zr, Cs, Pt or Sn.

An alternative coating that can be realized by the use of a method according to the invention comprises organic polymers which have been bonded together to form a continuous or discontinuous matrix, and further comprises inorganic very small particles (nanoparticles) of metal or silicon oxides or inorganic network structures. Such a coating structure is sometimes referred to as a Ceramer.

Another alternative coating that can be realized by the use of a method according to the invention comprises a metallic matrix which further comprises inorganic very small particles (nanoparticles) of metal or silicon oxides or inorganic network structures.

A coating that is realized in any case by the use of a method according to the invention comprises the inorganic network structure with organic residue groups of the structure that are based on an Ormocer but in which further very small inorganic particles of metal or silicon oxides, which may or may not be chemically bonded, are present. Such a structure is sometimes referred to by the term Nanomer.

The different constituents or components of a hybrid coating according to the invention are preferably formed from precursor molecules in a process of precursor activation. During this activation, the precursor molecules are dissociated. Dissociation of the precursors can be done by means of thermal dissociation, laser dissociation or other suitable methods that are known in the art. A particular preference is expressed for a method whereby the precursor molecules are activated by means of a plasma. According to the present invention, with great preference, the activation of the organic and inorganic precursors takes place in separate plasmas.

For the formation of an inorganic component, in many cases a precursor for a metal oxide, metal nitride, or metal carbide or a silicon oxide, silicon nitride or silicon carbide will be used. Since in the plasma strong dissociative activation takes place, as precursor for an inorganic component, compounds that comprise a direct metal-carbon, a metal-hydrogen, a metal-nitrogen, a metal-halide, or a metal-oxygen bond, such as organometal or metallorganic compounds, metal alkoxydes, metal halides, metal carboxylates, or metal-δ-diketonates can be chosen. It is also possible to use, as precursor for an inorganic component, compounds which comprise a direct silicon-carbon, a silicon-hydrogen, a silicon-nitrogen, a silicon-halide, or a silicon-oxygen bond, such as organosilicon compounds, silicon alkoxydes, silicon halides, siloxanes, silanes, silazanes, silicon carboxylates, or silicon-β-diketonates.

In case an organometal compound is selected, for the metal, any metal can be selected. Preferably, the metal is selected from the group consisting of aluminum, cadmium, cerium, chromium, cobalt, gold, copper, lanthanum, lead, manganese, molybdenum, nickel, osmium, palladium, platinum, tin, titanium, vanadium, tungsten, iron, silver, zinc, zirconium, alkali metal and alkaline earth metal. Preferably, the metal compound is selected from the group consisting of a metal alkoxyde, carboxylate or -β-diketonate. With greater preference, the organometal compound is a metal alkoxyde, carboxylate or β-diketonate in which the metal is Al, Mo, Ti, Zr, Cs, Pt or Sn.

For the formation of the nanoparticles, preferably a part of the inorganic component is deposited in the form of nanoparticles. These nanoparticles are formed through substantially complete dissociation of the inorganic precursors, such as, for instance, the metal or silicon alkoxydes, and condensation of activated molecules to virtually crystalline nanoparticles. Once captured and covalently bound, or not, in the hybrid coating, these nanoparticles offer the advantage that they impart very high scratch resistance to the hybrid coating. Preferably, in an embodiment according to the present invention, nanoparticles are formed having a diameter between 1 and 200 nm. With greater preference, the nanoparticles possess a diameter between 1 and 50 nm.

When an organic molecule is introduced into a plasma, the monomer draws energy from the plasma through non-elastic impacts and it is activated and fragmented into activated smaller molecules. The activated monomers combine with each other, thereby forming larger molecules, eventually resulting in a polymer. Because the plasma will fragment most organic compounds, plasma polymers can be deposited from virtually any organic monomer. Plasma polymers are in most cases highly branched and crosslinked, in most cases they are insoluble and adhere to solid surfaces. The chemical and physical properties of the plasma polymers depend on the precursor used, which is mostly introduced into the plasma in gas or vapor form, and the type of discharge (e.g. direct current, radiofrequency waves or microwaves) and the energy power introduced.

As precursor for an organic component, a multiplicity of organic compounds can be used. In fact, basically all conceivable organic substances can be activated as precursor in the organic plasma, and the components that are formed therefrom can be used in coatings according to the present invention.

As precursor for an organic component, in general, alkanes, alkynes, alkenes, arenes and optionally wholly or partly (cyclo)alkyl-, aryl-, aralkyl-, allyl-, methoxy-, halogen-, hydroxy-, amino-, nitro-, cyano-, epoxy, glycidoxy, (meth)acrylato substituted derivatives thereof are suitable for use in the present invention. Preferably, short chain alkanes ($C_{1-6}$), acrylate, styrene or carbon-fluorine compounds ($CF_4$, $C_2F_4$, $C_2F_6$ and $C_4F_{10}$) are used as organic precursor.

In the present description, the term alkanes is understood to refer to acyclic, branched or unbranched hydrocarbon of the general formula $C_nH_{2n+2}$ having from 1 to 10, preferably from 1 to 8 carbon atoms, such as ethane, methane, propane and pentane.

The term alkenes is understood to refer to acyclic branched or unbranched hydrocarbon having one double carbon-carbon bond and a general formula of $C_nH_{2n}$ having from 1 to 10, preferably from 1 to 8 carbon atoms. This is also understood to include the acyclic branched or unbranched hydrocarbons having more than one double carbon-carbon bond such as alkadienes, alkatrienes, etc.

The term alkynes is understood to refer to acyclic branched or unbranched hydrocarbons having a triple carbon-carbon bond and having the general formula $C_nH_{2n-2}$ having from 1 to 10, preferably from 1 to 8 carbon atoms. This is also understood to include the acyclic branched or unbranched hydrocarbons having more than one triple carbon-carbon bond, such as the alkadiynes, alkatriynes, etc.

In the present description, the term alkyl group refers to a monovalent group derived from an alkane through the removal of a hydrogen atom from one of the carbon atoms and comprises a straight chain or branched chain having from 1 to 10, preferably from 1 to 8 carbon atoms. The term (cyclo) alkyl group refers to an alkyl group or a cyclic alkyl radical. These last also encompass saturated or partly saturated monocyclic, bicyclic or tricyclic alkyl radicals in which each cyclic group contains 3 to 8 carbon atoms. Examples of such radicals are methyl, ethyl, n-propyl, isopropyl, n-butyl, isobutyl, sec-butyl, tert-butyl, pentyl, iso-amyl, hexyl, octyl, cyclopentyl, cyclopentenyl, cyclohexenyl, cyclohexyl, cyclopentadienyl and cyclooctadienyl.

The term aromatic group refers to arenes and substituted derivatives thereof, such as benzene, naphthalene, toluene and should be understood as comprising the heteroaromatic structures, such as thiophene and pyridine. Arenes refer to the monocyclic and polycyclic aromatic hydrocarbons. The term aryl refers to an aromatic or heteroaromatic ring system obtained from arenes by removal of a hydrogen atom from a ring carbon atom, such as a phenyl, naphthyl or anthracene group, optionally substituted with alkyl, methoxy, halogen, hydroxy, amino, nitro, or cyano.

The term aralkyl means an alkyl as defined above, in which one hydrogen atom has been replaced with an aryl group as defined above. Allyl refers to propene radicals $(CH_2)_2CH$. Halogen refers to fluorine, bromine, iodine or chlorine.

Organosilicon compounds, such as polydimethylsiloxanes (PDMS) with terminal trimethylsiloxy, hydroxy or hydride groups, hexamethyldisilazane (HMDSN), hexamethyldisiloxane (HMDSO), 1,3-divinyltetramethyl disiloxane (DVS), vinylpentamethyldisiloxane (VPMDSO), 1,1,3,3-tetramethyldisiloxane (TMDSO), 1,3,5,7-tetramethyl cyclotetrasilane (TMTSO), 2,4,6,8-tetravinyl-2,4,6,8-tetramethylcyclotetrasiloxane (TVTMTSO), diacetoxy-di-tert-butoxysilane (DADBS), triethoxysilane (TRIES) methyltrimethoxysilane (MTS), 1,2-bis(trimethylsilyloxy)ethane (TMSE), tetramethoxysilane (TMOS), tetraethoxysilane (TEOS), octamethyltrisiloxane (OMCTS), or tripropylsilane (TPS), organometal compounds and metal organic compounds also find very suitable application in embodiments according to the present invention and can be used with advantage as precursor of the organic as well as of the inorganic component.

Poly(p-xylylene), or parylene-N, can also be used with advantage as precursor for the organic component, as well as dimers, such as di-p-xylylene, or monomers, such as p-xylylene, and optionally functionalized compounds obtained or derived therefrom.

By 'optionally functionalized' is meant that these compounds may be chemically derivatized, so that, incorporated into the coating, they impart to this coating a functional property such as biocompatibility, hydrophobicity, anti-reflection or anti-stick properties. This can be realized, for instance, by the use of halogen functionalized derivatives, while the starting compounds have been halogenated with, for instance, fluorine or chlorine. Examples of functionalized compounds that can be used as precursor for the organic components are PPXC ([—$CH_2$—$C_6H_3Cl$—$CH_2$—]$_2$ as dimer), and AF-4 ($CF_3$—$C_6H_4$—$CF_3$).

The ratio of inorganic precursor/organic precursor can be varied, to obtain a more, or less, flexible material.

In the present invention, a plasma is understood to mean a gaseous or vaporous composition of constituents which under the influence of electric energy generated by a plasma source, has been brought to (gas) discharge. The space in which this discharge is effected is limited by an electric field which is generated by an electric power source and by a physical separation, if any is present, such as, for instance, a glass tube, and is called a plasma source.

In a wider sense, plasma source in the present invention is understood to mean an electric power source and the electrodes for generating an electric field as well as the space limited by this field, for discharge and activation of a gaseous or vaporous composition of constituents and any physical separation present. If in the present description properties or embodiments are assigned to the plasmas, these properties or embodiments also hold for the plasma source as far as they relate to it, and vice versa.

A coating according to the invention with a Nanomer structure can be very suitably obtained by the use of a single plasma source.

However, in the present invention, preferably at least two plasma sources of a different nature are used. Thus, preferably, in addition to a high electron density plasma source, a low electron density plasma source is used. However, two or more plasma sources of the same type can also be used in the present invention.

A high electron density plasma source typically has an electron density between $5 \times 10^{16}$-$5 \times 10^{19}$ electrons/$m^3$. An example of such a plasma source is an ICP (inductively coupled plasma) plasma source or an ECR (Electron Cyclotron Resonance). A low electron density plasma source typically has an electron density between $5 \times 10^{10}$-$5 \times 10^{16}$ electrons/$m^3$. An example of a low electron density plasma source is a CCP (capacitively coupled plasma) plasma source or a DC (direct current) plasma source.

Electron densities can be determined with methods known for that purpose, such as the Langmuir probe method, microwave or laser interferometry, or Thomson scattering.

A plasma composition in the present description is defined as a gaseous or vaporous composition which is supplied to the electric field generated by the plasma source to obtain the plasma regardless of whether this composition has already been brought to discharge.

A general embodiment of a device according to the invention for manufacturing a hybrid coating comprises a reactor space in which the chemical vapor deposition onto the substrate takes place and which is limited by a reactor vessel. The reactor space is provided with a carrier for a substrate. The device further comprises at least two separate plasma sources for the activation of the inorganic and organic precursor components.

Different preferred embodiments of such a device are suitable for manufacturing hybrid coatings according to the invention. A preferred embodiment is represented in FIG. 1. There is shown a reactor vessel (1) provided with a closed glass tube (16) at the top thereof, and an open communication (9) is provided between the reactor space (15) and the space limited by the glass tube (16).

Around the glass tube (16) an electric winding is arranged, which is connected to a first electric power source. This plasma source (4) can further be provided with a first precursor inlet (2) and a second precursor inlet (3) through which supply of a precursor of an inorganic component, argon gas and optionally oxygen can take place.

In reactor space (15), by means of a second plasma source (6), a plasma may be situated through provision of electrodes (1, 10), one of the electrodes (10) being also carrier for a substrate (10). This plasma source can be provided with its own precursor inlet (12).

The whole set-up can be suspended by way of a suspension device (14) and be provided with a grounding (13). Through the heating elements (8) the temperature of the reactor can be raised if required. Upon switching on of the first electric power source, in a high electron density plasma source (4) a plasma (5) is generated for activating the precursor of an inorganic component. Upon switching on of a second electric power source, in the low electron density plasma source (6) a plasma (7) is generated to activate a precursor for an organic component. Through the supply of gas through precursor inlets (2) and/or (3) and through simultaneous extraction of chemical vapors through outlet (11), the plasma of the high electron density plasma source (5) can move towards the reactor space (15) where it is directly captured in the low electron density plasma (7). Here, a further reaction of the high electron density plasma can take place, so that additional energy can be supplied to the inorganic component. As a consequence, the substrate provided on carrier (10) is then covered with a combination of organic and inorganic components and the additional energy supply provides for the growing coating being made denser. A certain fraction of the inorganic component will have condensed to very small particles and will be deposited as such.

This embodiment, however, concerns one of the possible embodiments and should not be construed as limiting the scope of the present invention. It will be clear to those skilled in the art that variations on the above described device are possible. Thus, it is possible to uncouple the high electron density plasma and the low electron density plasma. The design of the electric power sources, the manner in which the electric power source is arranged and the charge carriers are mutually coupled, and the distance between plasma and carrier for the substrate are not critical and can be adjusted. Suitable configurations for obtaining desired material properties can be determined through optimization.

Preferably, the coupled plasmas applied are high-frequency plasmas. A frequency of between 0.01 MHz and 10 GHz in this connection is very suitable for inducing discharge in the plasmas. It is greatly preferred that a frequency of between 1 and 50 MHz be used.

The plasmas can be situated in the direct vicinity of the substrate or at some distance therefrom. The situation where the substrate is arranged directly between the two electrodes (1, 10) of the low electron density plasma source (6) or in the electric field of a high electron density plasma source (4), in which cases a so-called direct plasma is involved, results in a higher thermal load on the substrate under the influence of exposure to high energy particles. Although not all substrates are suitable for high thermal loading, direct plasmas can still be used with great advantage in the present invention.

Preferably, in a device according to the invention, at least one plasma source is situated at some distance from the substrate. Such "remote" plasmas therefore find particularly suitable application in the present invention.

To pass the particles activated in the remote plasma to the substrate, it is practical that a device according to the invention be provided with transport means for a vapor phase. Such means can comprise "passive" means such as gravity, whereby the remote plasma, the substrate and the field of gravity are in one line. Also, active transport means for a vapor phase can be included in a device according to the invention. Such active systems can consist of a pressure gradient or an active air, vapor or gas stream in the processing direction. 'Processing direction' as used herein is the direction in which a plasma-activated particle must travel to reach the substrate and to deposit thereon.

An active air or gas stream can be generated by introducing air, vapor or gas with excess pressure into the device. To that end, a carrier gas such as $N_2$, argon, or any other suitable unreactive gas, or a gas involved in the activation reaction, such as oxygen, can be used.

Alternatively, an active air, vapor or gas stream can be generated by extracting air, vapor or gas from the device. The manner in which the pressure gradient or the active air, vapor or gas stream is obtained is not of preponderant importance in methods and devices of the invention. Preferably, the transport means for a vapor phase are realized by introducing gas with excess pressure into the device and simultaneously extracting vapor from the device, so that a reduced pressure, with respect to atmospheric pressure, is created in the device. This further promotes a stable plasma discharge. A pressure between 0.01 and 1000 mbara finds suitable application in embodiments according to the present invention. Good results have been obtained at a pressure in the device between 0.1 and 50 mbara.

The plasmas that can be used in the present invention are aimed at forming from precursor molecules, reactive intermediates that can be deposited on the substrate. Depending on the energy supplied to the plasma source, the precursor will be activated into a reacted and dissociated intermediate. The extent of dissociation can be set by choosing the level of the plasma source energy. Suitable powers in plasmas that are used in embodiments of the present invention are generally between 10 and 2500 Watts, with voltages varying between 0.001 and 5000 Volt.

Preferably, the plasma is pulsed to liberate the particles captured therein from the plasma volume and to effect deposition on the substrate to be coated. Preferably, a pulse frequency of 1 to 100 Hz is used. With greater preference, a pulse of approximately 25 Hz (with a duty cycle between 5 and 10%) is used.

Concentrations of precursors in a plasma composition according to the invention are generally between 1 and 25 vol. %. Optionally, in addition oxygen can be supplied to the plasma composition to a concentration of approximately 80%.

Besides precursor molecules, the plasma composition comprises an unreactive carrier gas such as $N_2$ or a noble gas such as argon, helium, neon, krypton, radon and/or xenon or a combination of these gases to supplement the volume. The plasma volume is preferably supplemented with argon gas. The formation of the inorganic precursor plasma is preferably effected by bringing the mixture of oxygen, precursor molecules and argon gas to electric discharge in a plasma source. The reactions thereby occurring lead to dissociation or activation of the precursor molecules.

Upon leaving the plasma, the activated intermediates preferably move substantially towards the substrate on which they can deposit and if possible substantially polymerize/condense. A considerable advantage of the present invention is that it is possible according to the proposed method to adjust the composition, and hence the properties of the hybrid coating, to any desired specification or application.

The ratio of inorganic to organic components, the density of the hybrid material that is manufactured in this way and the amount of nanoparticles present can be fully controlled. In this way, many different specific properties can be imparted to the material. Also, to the different plasmas additives can be added, enabling specific properties to be imparted to a coating according to the invention. The following properties can be recognized and specifically imparted:

Anti-soiling action can be achieved by the use or addition of halides in the plasma in that these will reduce the surface energy of the eventual coating.

A high degree of wear resistance is achieved by incorporating nanoparticles of silicon oxides or metal oxides in the coating.

Enhanced barrier action can be achieved by depositing as large an amount of inorganic material as possible. Also, there is the possibility of alternately stacking organic and inorganic layers onto each other and in this way enhancing the barrier action.

The color of the coating can be varied by the use of specific layer thicknesses or by vapor depositing pigments.

The structure or the porosity of the coating can, if necessary, be adjusted at will by choosing the plasma parameters such that to a greater or lesser extent a bias voltage is created on the substrate. Further, it is possible to start from a DC (direct current) plasma source.

The hydrophobicity or hydrophilic character of the coating can be varied by the use of, respectively, carbon-fluorine compounds and the addition of extra hydrogen atoms in the form of $H_2$ gas to a plasma. What can thus be achieved, for instance, is that optical materials (spectacle glasses, lenses) get fogged less easily.

Any substrate is suitable to be clad with a coating according to the invention provided that the activated intermediates can adhere to it. Suitable substrates for applying a coating according to the present invention are substrates of plastic, including glass-replacing plastic. Such glass-replacing plastics can be used to replace spectacle glass, in solar cells and as material for lenses and car headlight glass. Also substrates of metal, glass, ceramics, paper or textile can be clad with a coating according to the present invention.

A coating according to the invention also finds suitable application as a barrier coating such as it is used, for instance, in P-LEDs (polymeric light emitting diode) in the semiconductor industry, but also in packaging material in the food industry, such as improved PET bottles or crisps bags. Virtually any application where a material having a higher wear resistance or scratch resistance is desired can benefit from the coating and the method of preparation which is provided in the present invention.

The thickness of the coating can be adjusted by varying the vapor deposition time (the period in which the substrate is exposed to the chemical vapor phase). Thicker coatings are achieved after longer vapor deposition times. Optionally, the deposition rate of the different activated components can be increased by supplying more energy to the plasmas or by increasing the gas or vapor stream through the device.

The substrate can optionally be cleaned or otherwise treated to improve the adhesion of activated intermediates, and hence the entire coating. Such treatment methods are known in the art and comprise treatment with, for instance, HF, $NH_4OH$ or $H_2SO_4$, or with the aid of a plasma according to methods known for that purpose.

EXAMPLE 1

Method for CVD of a Hybrid Coating

With the aid of a device as represented in FIG. 1, a hybrid coating was manufactured on a plastic substrate, e.g. PC (polycarbonate) or ABS (acrylonitrile butadiene styrene). As precursor for the inorganic component, tetraethoxysilane was used. A high electron density plasma to activate this component was composed on the basis of 4% precursor, 40% oxygen, supplemented with argon and a total flow of 0.5 SLM (Standard liter per minute).

As precursor for the organic component, separately, both 1,2-bis(trimethylsilyloxy)ethane (TMSE), tetraethoxysilane (TEOS) and tri-n-propylsilane (TPS) were used. A low electron density plasma to activate this component was composed on the basis of 15% precursor (TMSE), 0% oxygen, supplemented with argon and a total flow of 0.1 SLM. Further, this plasma comprised products coming from the high electron density plasma.

The high electron density plasma was generated by setting a power of 300 watt, resulting in a high-frequency alternating voltage of at most 2000 Volts (RF peak) and thus allowing the gases to discharge.

The low electron density plasma was generated by applying an electric voltage of 150 volts (DC bias) between the electrode/carrier (10) and the reactor casing (1) and to allow this to discharge with a frequency of 13.56 MHz (set power of 300 Watt).

The high electron density plasma was pulsed with a frequency of 25 Hz (with a duty cycle between 5 and 10%). The pressure in the reactor vessel was lowered to 1.5 mbara.

The reactor operated at room temperature. During the vapor deposition process, some heating of the substrate occurred as a result of the plasma but higher temperatures than 150° C. were not observed.

In 10 minutes time, a coating was obtained of a layer thickness between 1 and 1.5 micrometer. FTIR analyses show inter alia Si—C, Si—O and C—H bonds. Taber tests to measure the wear give a comparable result to that obtained with hybrid coatings applied via wet chemical techniques. The transmission in the visible range of the obtained coatings is greater than 70%.

The invention claimed is:

1. A method for applying a hybrid coating to a substrate, which coating comprises
    an inorganic and an organic component and which inorganic component comprises nanoparticles, wherein precursors for said organic and inorganic component are activated in two or more separate plasma sources for plasma activated deposition of a chemical vapor phase, wherein said activated precursors are combined before they are deposited on the substrate from the chemical vapor phase for forming the coating, and wherein the inorganic component is generated in a high electron density high-frequency plasma and wherein the high electron density high-frequency plasma is pulsed.

2. A method according to claim 1, wherein one of the two activated precursors passes the plasma for activation of the other precursor, whereafter said activated precursors are combined.

3. A method according to claim 2, wherein the activated inorganic precursor passes the plasma for activation of the organic precursor.

4. A method according to claim 2, wherein the activated organic precursor passes the plasma for activation of the inorganic precursor.

5. A method according to claim 1, wherein the organic component is generated in a low electron density high-frequency plasma.

6. A method according to claim 5, wherein the low electron density high-frequency plasma is pulsed.

7. A method according to claim 1, wherein the precursor for the inorganic component comprises metal-carbon, metal-hydrogen, metal-nitrogen, metal-halide, and/or metal-oxygen bonds.

8. A method according to claim 6, wherein the precursor for the inorganic component comprises an organometal compound, a metal organic compound, metal alkoxide, metal carboxylate, or metal-β-diketonate.

9. A method according to claim 7, wherein the metal comprises aluminum, titanium, zirconium, molybdenum, cesium, tin and/or platinum.

10. A method according to claim 1, wherein the precursor for the inorganic component comprises silicon-carbon, silicon-hydrogen, silicon-nitrogen, silicon-halide, and/or silicon-oxygen bonds.

11. A method according to claim 10, wherein the precursor for the inorganic component comprises an organosilicon compound, silicon alkoxide, siloxane, silane, silazane, silicon carboxylate, or silicon-β-diketonate.

12. A method according to claim 1, wherein the precursor for the organic component comprises alkanes, alkynes, alkenes, arenes, and optionally wholly or partly (cyclo)alkyl-, aryl-, aralkyl-, allyl-, methoxy-, halogen-, hydroxy-, amino-, nitro-, or cyano-substituted derivatives thereof.

13. A method according to claim 1, wherein the precursor for the organic component comprises short chain alkanes, acrylate, styrene or carbon-fluorine compounds.

14. A method according to claim 1, wherein the precursor for the organic component comprises an organosilicon compound, organometal compound, metal organic compound or p-xylylene, and/or optionally functionalized compounds derived therefrom.

15. A method according to claim 1, wherein the separate activation sources are situated in a reactor in which a pressure of between 0.01 and 1000 mbar prevails.

16. A method according to claim 1, wherein the separate activation sources are situated in a reactor in which a pressure of 0.1 to 50 mbar prevails.

17. A method according to claim 1, wherein the plasmas are formed by bringing a mixture of precursor material, argon gas and optionally oxygen to electrical discharge.

18. A method according to claim 1, wherein to the low electron density plasma, also vapor coming from the high electron density plasma is supplied.

19. A method according to claim 1, wherein to the high electron density plasma, also vapor coming from the low electron density plasma is supplied.

20. The method of claim 1, wherein the high electron density high-frequency plasma is pulsed at a pulse frequency of from about 1 to about 100 Hz.

21. The method of claim 1, wherein the pulse frequency is 25 Hz with a duty cycle between about 5% to about 10%.

* * * * *